United States Patent
Ohbo et al.

(10) Patent No.: US 6,756,245 B2
(45) Date of Patent: Jun. 29, 2004

(54) METHOD OF FABRICATING SEMICONDUCTOR DEVICE

(75) Inventors: Hiroki Ohbo, Hirakata (JP); Nobuhiko Hayashi, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/244,513

(22) Filed: Sep. 17, 2002

(65) Prior Publication Data

US 2003/0010983 A1 Jan. 16, 2003

Related U.S. Application Data

(62) Division of application No. 09/666,557, filed on Sep. 21, 2000, now Pat. No. 6,534,800.

(30) Foreign Application Priority Data

Sep. 24, 1999 (JP) .......................................... 11-271126

(51) Int. Cl.$^7$ .............................................. H01L 21/00
(52) U.S. Cl. .......................................... 438/46; 438/33
(58) Field of Search ...................................... 438/46, 33

(56) References Cited

U.S. PATENT DOCUMENTS

| | | | |
|---|---|---|---|
| 5,914,496 A | 6/1999 | Thijs et al. | |
| 5,939,733 A | 8/1999 | Sato | |
| 6,064,079 A | 5/2000 | Yamamoto et al. | |
| 6,111,275 A | 8/2000 | Hata | 257/97 |
| 6,147,364 A | 11/2000 | Itaya et al. | |
| 6,215,803 B1 | 4/2001 | Hata | 372/46 |
| 6,284,559 B1 | 9/2001 | Hata | 438/46 |
| 6,335,218 B1 * | 1/2002 | Ota et al. | |
| 6,388,275 B1 | 5/2002 | Kano | |
| 6,455,342 B2 * | 9/2002 | Kobayashi et al. | |

FOREIGN PATENT DOCUMENTS

| | | |
|---|---|---|
| EP | 0549278 A1 | 6/1993 |
| EP | 0609799 A2 * | 8/1994 |
| JP | 08-264899 | 11/1996 |
| JP | 10-84165 | 3/1998 |
| JP | 10-321962 | 12/1998 |
| WO | WO99/09602 | 2/1999 |

OTHER PUBLICATIONS

Japanese Journal of Applied Physics, vol. 37, (1998), pp. 1470–1473—Part 1, No. 3B, Mar. 1998.
Optical Device by Japan Society for the Promotion of Science, JSPS (Jul. 27, 1999), pp. 27–33.
Notification of Reasons for Refusal (Office Action) dated Apr. 22, 2003 in the counterpart Japanese application (JP11-271126) and its translation thereof.

* cited by examiner

*Primary Examiner*—Stephen D. Meier
*Assistant Examiner*—Keisha Rose
(74) *Attorney, Agent, or Firm*—Westerman, Hattori, Daniels & Adrian, LLP

(57) ABSTRACT

An AlGaN buffer layer, an undoped GaN layer, an n-GaN contact layer, an n-InGaN crack preventing layer, an n-AlGaN cladding layer, an MQW active layer, and a p-AlGaN cladding layer are formed in this order on a sapphire substrate. A ridge portion is formed in the p-AlGaN cladding layer, and a p-GaN cap layer is formed on an upper surface of the ridge portion. An n-AlGaN first regrown low-temperature buffer layer and an n-AlGaN current blocking layer are formed in this order on a flat portion and on side surfaces of the ridge portion in the p-AlGaN cladding layer. A p-AlGaN second regrown low-temperature buffer layer and a p-GaN contact layer are formed on the n-AlGaN current blocking layer and on the upper surface of the ridge portion.

9 Claims, 6 Drawing Sheets

METHOD OF FABRICATING SEMICONDUCTOR DEVICE

This application is a divisional of application Ser. No. 09/666,557, filed Sep. 21, 2000, now U.S. Pat. No. 6,534,800.

BACKGROUND OF THE INVENTION

1. Field of the Invention

The present invention relates to a semiconductor device having a compound semiconductor layer composed of GaN (gallium nitride), AlN (aluminum nitride), InN (indium nitride), BN (boron nitride), or TlN (thallium nitride) or an III-V group nitride based semiconductor (hereinafter referred to as a nitride based semiconductor) which is their mixed crystal, and a method of fabricating the same.

2. Description of the Background Art

In recent years, GaN based semiconductor light emitting devices have been put to practical use as semiconductor light emitting devices such as light emitting diodes and semiconductor laser devices which emit light in blue or violet.

FIG. 8 is a cross-sectional view showing an example of a conventional GaN based semiconductor laser device.

The semiconductor laser device shown in FIG. 8 is fabricated in the following manner.

In a crystal growth device such as an MOCVD (Metal Organic Chemical Vapor Deposition) device or an MBE (Molecular Beam Epitaxy) device, an AlGaN buffer layer 102 composed of undoped AlGaN, an undoped GaN layer 103, an n-GaN contact layer 104, an n-AlGaN cladding layer 105, an n-GaN optical guide layer 106, an InGaN quantum well active layer 107, a p-AlGaN layer 108, a p-GaN optical guide layer 109, a p-AlGaN cladding layer 110, and a p-AlGaN cap layer 111 are successively grown on a C(0001) plane of a sapphire substrate 101.

Subsequently, a wafer is taken out of the crystal growth device, to etch predetermined regions of the p-AlGaN cap layer 111 and the p-AlGaN cladding layer 110 by RIBE (Reactive Ion Beam Etching) or the like. A ridge portion is thus formed.

After the ridge portion is formed, the wafer is returned to the crystal growth device again, to grow an n-AlGaN current blocking layer 112 on side surfaces and an upper surface of the ridge portion as well as on a flat portion of the p-AlGaN cladding layer 110. Further, the wafer is taken out of the crystal growth device, to etch the n-AlGaN current blocking layer 112 on the upper surface of the ridge portion to form a striped opening. The upper surface of the ridge portion is thus exposed. Thereafter, the wafer is returned to the crystal growth device again, to grow a p-GaN contact layer 113 on the n-AlGaN current blocking layer 112 and on the upper surface of the ridge portion.

Subsequently, the wafer is taken out of the crystal growth device, to etch a partial region from the p-GaN contact layer 113 to the n-GaN contact layer 104 away. A predetermined region of the n-GaN contact layer 104 is thus exposed. Further, an n electrode 50 is formed on the exposed predetermined region of the n-GaN contact layer 104. Further, a p electrode 51 is formed on a predetermined region of the p-GaN contact layer 113. Finally, the sapphire substrate 101 is cleaved, to form an end surface of a cavity.

In the semiconductor laser device having a ridge wave-guided structure as shown in FIG. 8, the ridge portion is formed, thereby creating a refractive index distribution in the horizontal direction of the InGaN quantum well active layer 107 as well as narrowing down a current. Light is horizontally confined, that is, transverse mode control is carried out in the semiconductor laser device utilizing the refractive index distribution and the current narrowed down.

Generally when the nitride based semiconductor layer is grown such that it is thick, it is liable to be cracked. In the nitride based semiconductor layer, an AlGaN layer containing Al is liable to be particularly cracked. In fabricating the above-mentioned semiconductor laser device having a ridge wave-guided structure, it is necessary to take the wafer out of the crystal growth device when the ridge portion is formed and when the striped opening in the n-AlGaN current blocking layer 112 is formed to subject the wafer taken out to etching, and then return the wafer to the crystal growth device again to grow the n-AlGaN current blocking layer 112 and the p-GaN contact layer 113.

Particularly in the n-AlGaN current blocking layer 112, the refractive index must be made lower (the band-gap must be made larger), as compared with that in the cladding layer in order to carry out the transverse mode control. In the n-AlGaN current blocking layer 112, therefore, the Al composition ratio is increased. The thickness of the n-AlGaN current blocking layer 112 is increased such that the current is sufficiently narrowed down by the n-AlGaN current blocking layer 112. The n-AlGaN current blocking layer 112 having a high Al composition ratio and having a large thickness is liable to be particularly cracked.

Since the thickness of the p-GaN contact layer 113 is also large, the p-GaN contact layer 113 is liable to be cracked.

When the wafer is taken out of the crystal growth device as described above, a surface of the wafer is oxidized. At the time of regrowth, the nitride based semiconductor layer is grown on the oxidized surface. Accordingly, lattice defects occur in the regrown layer. That is, in fabricating the semiconductor laser device, the wafer is taken out of the crystal growth device at the time of forming the ridge portion. Consequently, the flat portion of the p-AlGaN cladding layer 110 and the ridge portion as well as the surface of the p-GaN cap layer 111 are oxidized. The n-AlGaN current blocking layer 112 is regrown on the flat portion of the p-AlGaN cladding layer 110 and the ridge portion as well as the surface of the p-GaN cap layer 111, which have been oxidized. Lattice defects occur in the n-AlGaN current blocking layer 112. When a striped opening is also formed in the n-AlGaN current blocking layer 112, the wafer is taken out of the crystal growth device. Consequently, the surfaces of the p-GaN cap layer 111 and the n-AlGaN current blocking layer 112 are oxidized. The p-GaN contact layer 113 is regrown again on the oxidized surfaces of the p-GaN cap layer 111 and the n-AlGaN current blocking layer 112. Accordingly, lattice defects also occur in the p-GaN contact layer 113.

The occurrence of the crack and the degradation of crystallizability in the n-AlGaN current blocking layer 112 and the p-GaN contact layer 113 which have been regrown, as described above, degrade device characteristics and decrease reliability in the semiconductor laser device.

Particularly, the occurrence of the crack and the degradation of the crystallizability in the n-AlGaN current blocking layer 112 degrade the device characteristics and decrease the reliability. Therefore, a method of fabricating a semiconductor laser device with a transverse mode is difficult.

SUMMARY OF THE INVENTION

An object of the present invention is to provide a semiconductor device in which the occurrence of a crack and the degradation of crystallizability in a layer regrown after processing such as etching are prevented.

Another object of the present invention is to provide a method of fabricating a semiconductor device in which the occurrence of a crack and the degradation of crystallizability in a layer regrown after processing such as etching can be prevented.

A semiconductor device according to an aspect of the present invention comprises a first semiconductor layer composed of a nitride based semiconductor whose upper surface is patterned; a buffer layer composed of a nitride based semiconductor positioned on the first semiconductor layer; and a second semiconductor layer composed of a nitride based semiconductor positioned on the buffer layer.

The buffer layer is a layer which can be grown without being affected by lattice defects in the underlying nitride based semiconductor layer. The buffer layer makes it possible to reduce the number of lattice defects in the nitride based semiconductor layer positioned on the buffer layer. Further, the buffer layer is a layer capable of reducing the difference in the coefficient of thermal expansion between two types of nitride based semiconductor layers, which differ in composition, positioned above and below the buffer layer. Further, the buffer layer is a layer grown at a lower temperature than the growth temperature of the first and second semiconductor layers, which is in a state close to an amorphous state, is liable to be modified by temperature changes in the crystal growth device, and is crystallized by temperature rise.

In the semiconductor device according to the aspect of the present invention, the second semiconductor layer is formed on the first semiconductor layer through the buffer layer. The buffer layer can be grown without being affected by the lattice defects in the underlying first semiconductor layer. Accordingly, the number of lattice defects in the second semiconductor layer is reduced. Further, the difference in the coefficient of thermal expansion between the first semiconductor layer and the second semiconductor layer is reduced. Consequently, the second semiconductor layer can be prevented from being cracked, and good crystallizability is realized therein. From the foregoing, device characteristics and reliability are improved.

It is preferable that the buffer layer is a layer grown at a substrate temperature of not less than 500° C. nor more than 700° C. The buffer layer grown at such a low temperature is in a state close to an amorphous state, is liable to be deformed by temperature changes in the crystal growth device, and is crystallized by temperature rise.

The first semiconductor layer may comprise an active layer, and a cladding layer having a flat portion and a ridge portion on the flat portion in this order, the buffer layer may be provided on the flat portion and on side surfaces of the ridge portion in the cladding layer, and the second semiconductor layer may comprise a current blocking layer formed on the buffer layer.

In fabricating the semiconductor device, the substrate on which the first semiconductor layer comprising the active layer and the cladding layer in this order is taken out of the crystal growth device once, to remove a region excluding a striped region at the center of the cladding layer and form the ridge portion and the flat portion in the cladding layer.

The semiconductor device is taken out of the crystal growth device once when the ridge portion and the flat portion are formed. Accordingly, surfaces of the flat portion and the ridge portion in the cladding layer are oxidized. However, the current blocking layer is formed on the flat portion and on the side surfaces of the ridge portion in the cladding layer through the buffer layer. Accordingly, the current blocking layer can be grown without being affected by the oxidized surfaces of the flat portion and the ridge portion in the cladding layer. Further, the difference in the coefficient of thermal expansion between the cladding layer and the current blocking layer is reduced by the buffer layer. Therefore, the current blocking layer can be prevented from being cracked, and good crystallizability is realized therein.

As described in the foregoing, in the semiconductor device, the occurrence of the crack and the degradation of the crystallizability in the current blocking layer are prevented, thereby improving device characteristics and reliability. Consequently, it is easy to fabricate a semiconductor laser device with a transverse mode.

In the foregoing, it is preferable that the thickness of the buffer layer is not less than 20 Å nor more than 500 Å. The buffer layer having such a thickness is formed, thereby making it possible to reduce the number of lattice defects in the current blocking layer positioned on the buffer layer as well as making it possible to reduce the difference in the coefficient of thermal expansion between the current blocking layer and the cladding layer, which differ in composition, positioned above and below the buffer layer.

The first semiconductor layer may comprise an active layer, a cladding layer having a flat portion and a ridge portion on the flat portion, and a current blocking layer provided on the flat portion and on side surfaces of the ridge portion in the cladding layer, and the buffer layer may be provided on an upper surface of the ridge portion of the cladding layer and on the current blocking layer.

In fabricating the semiconductor device, the substrate on which the first semiconductor layer comprising the active layer, the cladding layer, and the current blocking layer are formed in this order is taken out of the crystal growth device once, and is subjected to predetermined processing, to expose the upper surface of the ridge portion of the cladding layer.

In the semiconductor device, the above-mentioned predetermined processing is performed outside the crystal growth device. Accordingly, the surfaces of the current blocking layer and the ridge portion of the cladding layer are oxidized. However, the second semiconductor layer is formed on the current blocking layer and on the upper surface of the ridge portion of the cladding layer through the buffer layer. Accordingly, the second semiconductor layer can be grown without being affected by the oxidized surfaces of the current blocking layer and the ridge portion of the cladding layer. Further, the difference in the coefficient of thermal expansion between the current blocking layer as well as the cladding layer and the second semiconductor layer is reduced by the buffer layer. Consequently, the second semiconductor layer can be prevented from being cracked, and good crystallizability is realized therein.

As described in the foregoing, in the above-mentioned semiconductor device, the occurrence of the crack and the degradation of the crystallizability in the second semiconductor layer are prevented, thereby improving device characteristics and reliability. Consequently, it is easy to fabricate a semiconductor laser device with a transverse mode.

In the foregoing, it is preferable that the thickness of the buffer layer is not less than 20 Å nor more than 150 Å. The buffer layer having such a thickness is formed, thereby making it possible to reduce the number of lattice defects in the second semiconductor layer positioned on the buffer layer as well as to reduce the difference in the coefficient of thermal expansion between the current blocking layer as well as the cladding layer and the second semiconductor layer, which differ in composition, positioned above and below the buffer layer.

In a case where the buffer layer is thus formed on the upper surface of the ridge portion serving as a current injection region, it is more preferable that the thickness of the buffer layer is small in order to cause a current to easily flow.

A cap layer may be further provided between the upper surface of the ridge portion and the buffer layer. In this case, it is possible to prevent the cladding layer in the ridge portion from being oxidized by the cap layer.

The first semiconductor layer may comprise an active layer, a cladding layer, and a current blocking layer having a striped opening, and the buffer layer may be provided on the current blocking layer and on an inner bottom surface and inner side surfaces of the striped opening.

In fabricating the semiconductor device, the substrate on which the first semiconductor layer comprising the active layer, the cladding layer, and the current blocking layer in this order is taken out of the crystal growth device once, and is subjected to predetermined processing, to form a striped opening in the current blocking layer.

In the semiconductor device, the striped opening is formed in the current blocking layer outside the crystal growth device. Accordingly, the surfaces of the current blocking layer and the first semiconductor layer inside the striped opening are oxidized. However, the second semiconductor layer is formed on the current blocking layer and on the first semiconductor layer exposed in the striped opening through the buffer layer. Accordingly, the second semiconductor layer can be grown without being affected by the oxidized surfaces of the current blocking layer and the first semiconductor layer. Further, the difference in the coefficient of thermal expansion between the current blocking layer as well as the cladding layer and the second semiconductor layer is reduced by the buffer layer. Consequently, the second semiconductor layer can be prevented from being cracked, and good crystallizability is realized therein.

As described in the foregoing, in the semiconductor device, the occurrence of the crack and the degradation of the crystallizability in the second semiconductor layer are prevented, thereby improving device characteristics and reliability. Consequently, it is easy to fabricate a semiconductor laser device with a transverse mode.

In the foregoing, it is preferable that the thickness of the buffer layer is not less than 20 Å nor more than 150 Å. The buffer layer having such a thickness is formed, thereby making it possible to reduce the number of lattice defects in the second semiconductor layer positioned on the buffer layer as well as to reduce the difference in the coefficient of thermal expansion between the current blocking layer as well as the first semiconductor layer and the second semiconductor layer, which differ in composition, positioned above and below the buffer layer.

When the buffer layer is thus formed on the bottom surface of the striped opening in the current blocking layer serving as a current injection region, it is more preferable that the thickness of the buffer layer is small in order to cause a current to easily flow.

In the foregoing, the nitride based semiconductor may be an III group nitride based semiconductor containing at least one of gallium, aluminum, indium, thallium, and boron.

Furthermore, in the foregoing, it is preferable that the nitride based semiconductor composing the buffer layer contains aluminum, and the composition ratio of the aluminum in the buffer layer is more than zero and less than 0.7. The buffer layer having such an aluminum composition ratio makes it possible to reduce the number of lattice defects in the second nitride based semiconductor layer positioned on the buffer layer as well as to reduce the difference in the coefficient of thermal expansion between the first and second semiconductor layers, which differ in composition, positioned above and below the buffer layer.

A method of fabricating a semiconductor device according to another aspect of the present invention comprises the steps of forming a first semiconductor layer composed of a nitride based semiconductor on a substrate inside a crystal growth device at a first temperature; taking the substrate on which the first semiconductor layer is formed out of the crystal growth device to subject the substrate taken out to predetermined processing; forming a buffer layer composed of a nitride based semiconductor inside the crystal growth device on the first semiconductor layer on the processed substrate at a second temperature lower than the first temperature; and forming a second semiconductor layer composed of a nitride based semiconductor at a temperature higher than the second temperature on the buffer layer inside the crystal growth device.

In the method of fabricating a semiconductor device according to the aspect, the second semiconductor layer grown at a high temperature is formed on the first semiconductor layer which has been taken out of the crystal growth device once and cooled through the buffer layer.

In taking the substrate on which the first semiconductor layer is formed out of the crystal growth device to subject the substrate taken out to predetermined processing, the surface of the first semiconductor layer is oxidized. As the buffer layer can be grown without being affected by lattice defects in the underlying first semiconductor layer, the number of lattice defects in the second semiconductor layer is reduced. Further, the difference in the coefficient of thermal expansion between the first semiconductor layer and the second semiconductor layer is reduced by the buffer layer. Consequently, the second semiconductor layer can be prevented from being cracked, and good crystallizability is realized therein. From the foregoing, device characteristics and reliability are improved.

In the foregoing, it is preferable that the step of forming the buffer layer comprises the step of forming the buffer layer at the second temperature of not less than 500° C. nor more than 700° C. The buffer layer grown at such a low temperature is in a state close to an amorphous state, is liable to be modified by temperature changes in the crystal growth device, and is crystallized by temperature rise. The buffer layer grown in the foregoing step makes it possible to reduce the number of lattice defects in the second semiconductor layer positioned on the buffer layer as well as to reduce the difference in the coefficient of thermal expansion between the first and second semiconductor layers, which differ in composition, positioned above and below the buffer layer.

The step of forming the first semiconductor layer may comprise the step of forming an active layer and the step of forming a cladding layer on the active layer, the step of performing the predetermined processing may comprise the step of removing a region excluding a striped region at the center of the cladding layer, to form a flat portion and a ridge portion on the flat portion, the step of forming the buffer layer may comprise the step of forming the buffer layer on the flat portion and on side surfaces of the ridge portion, and the step of forming the second semiconductor layer may comprise the step of forming a current blocking layer on the buffer layer.

The semiconductor device is taken out of the crystal growth device once in forming the ridge portion and the flat portion. Accordingly, the surfaces of the flat portion and the ridge portion in the cladding layer are oxidized. However, the current blocking layer is formed on the flat portion and on the side surfaces of the ridge portion in the cladding layer through the buffer layer. Accordingly, the current blocking layer can be grown without being affected by the oxidized surfaces of the flat portion and the ridge portion in the cladding layer. Further, the difference in the coefficient of thermal expansion between the cladding layer and the current blocking layer is reduced by the buffer layer. Consequently, the current blocking layer can be prevented from being cracked, and good crystallizability is realized therein.

As described in the foregoing, in the semiconductor device, the occurrence of the crack and the degradation of the crystallizability in the current blocking layer are prevented, thereby improving device characteristics and reliability. Consequently, it is easy to fabricate a semiconductor laser device with a transverse mode.

In the foregoing, it is preferable that the step of forming the buffer layer comprises the step of forming the buffer layer having a thickness of not less than 20 Å nor more than 500 Å. The buffer layer having such a thickness is formed, thereby making it possible to reduce the number of defects in the current blocking layer positioned on the buffer layer as well as to reduce the difference in the coefficient of thermal expansion between the current blocking layer and the cladding layer, which differ in composition, positioned above and below the buffer layer.

The step of forming the first semiconductor layer may comprise the step of forming an active layer, the step of forming a cladding layer having a flat portion on the active layer and a ridge portion on the flat portion, and the step of forming a current blocking layer on the cladding layer, the step of performing the predetermined processing may comprise the step of forming a striped opening in the current blocking layer, to expose an upper surface of the ridge portion, and the step of forming the buffer layer may comprise the step of forming the buffer layer on the current blocking layer and on an inner bottom surface and inner side surfaces of the striped opening.

In the semiconductor device, the above-mentioned predetermined processing is performed outside the crystal growth device. Accordingly, the surfaces of the current blocking layer and the ridge portion of the cladding layer are oxidized. However, the second semiconductor layer is formed on the current blocking layer and on the upper surface of the ridge portion of the cladding layer through the buffer layer. Accordingly, the second semiconductor layer can be grown without being affected by the oxidized surfaces of the current blocking layer and the ridge portion of the cladding layer. Further, the difference in the coefficient of the thermal expansion between the current blocking layer as well as the cladding layer and the second semiconductor layer can be reduced by the buffer layer. Consequently, the second semiconductor layer can be prevented from being cracked, and good crystallizability is realized therein.

As described in the foregoing, in the semiconductor device, the occurrence of the crack and the degradation of the crystallizability in the second semiconductor layer are prevented, thereby improving device characteristics and reliability. Consequently, it is easy to fabricate a semiconductor laser device with a transverse mode.

In the foregoing, it is preferable that the step of forming the buffer layer comprises the step of forming the buffer layer having a thickness of not less than 20 Å nor more than 150 Å. The buffer layer having such a thickness is formed, thereby making it possible to reduce the number of lattice defects in the second semiconductor layer positioned on the buffer layer as well as to reduce the difference in the coefficient of thermal expansion between the current blocking layer as well as the cladding layer and the second semiconductor layer, which differ in composition, positioned above and below the buffer layer.

When the buffer layer is thus formed on the upper surface of the ridge portion serving as a current injection region, it is more preferable that the thickness of the buffer layer can be decreased in order to cause a current to easily flow.

The step of forming the first semiconductor layer may comprise the step of forming a cap layer on the upper surface of the ridge portion of the cladding layer. In this case, the oxidation of the cladding layer in the ridge portion can be reduced by the cap layer.

The step of forming the first semiconductor layer may comprise the step of forming an active layer, the step of forming a cladding layer on the active layer, and the step of forming a current blocking layer on the cladding layer, the step of performing the predetermined processing may comprise the step of forming a striped opening in the current blocking layer, to expose the first semiconductor layer inside the striped opening, and the step of forming the buffer layer may comprise the step of forming a buffer layer on the current blocking layer and an inner bottom surface and inner side surfaces of the striped opening.

In the semiconductor device, the striped opening is formed in the current blocking layer outside the crystal growth device. Accordingly, the surfaces of the current blocking layer and the first semiconductor layer inside the striped opening are oxidized. However, the second semiconductor layer is formed on the current blocking layer and on the first semiconductor layer exposed inside the striped opening through the buffer layer. Accordingly, the second semiconductor layer can be grown without being affected by the oxidized surfaces of the current blocking layer and the first semiconductor layer. Further, the difference in the coefficient of thermal expansion between the current blocking layer as well as the first semiconductor layer and the second semiconductor layer is reduced by the buffer layer. Consequently, the second semiconductor layer can be prevented from being cracked, and good crystallizability is realized therein.

As described in the foregoing, in the semiconductor device, the occurrence of the crack and the degradation of the crystallizability in the second semiconductor layer are prevented, thereby improving device characteristics and reliability. Consequently, it is easy to fabricate a semiconductor laser device with a transverse mode.

In the foregoing, it is preferable that the step of forming the buffer layer comprises the step of forming the buffer layer having a thickness of not less than 20 Å nor more than 150 Å. The buffer layer having such a thickness is formed, thereby making it possible to reduce the number of lattice defects in the second semiconductor layer positioned on the buffer layer as well as to reduce the difference in the coefficient of thermal expansion between the current blocking layer as well as the first semiconductor layer and the second semiconductor layer, which differ in composition, positioned above and below the buffer layer.

When the buffer layer is thus formed on the bottom surface of the striped opening in the current blocking layer serving as a current injection region, it is preferable that the thickness of the buffer layer is decreased in order to cause a current to easily flow.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
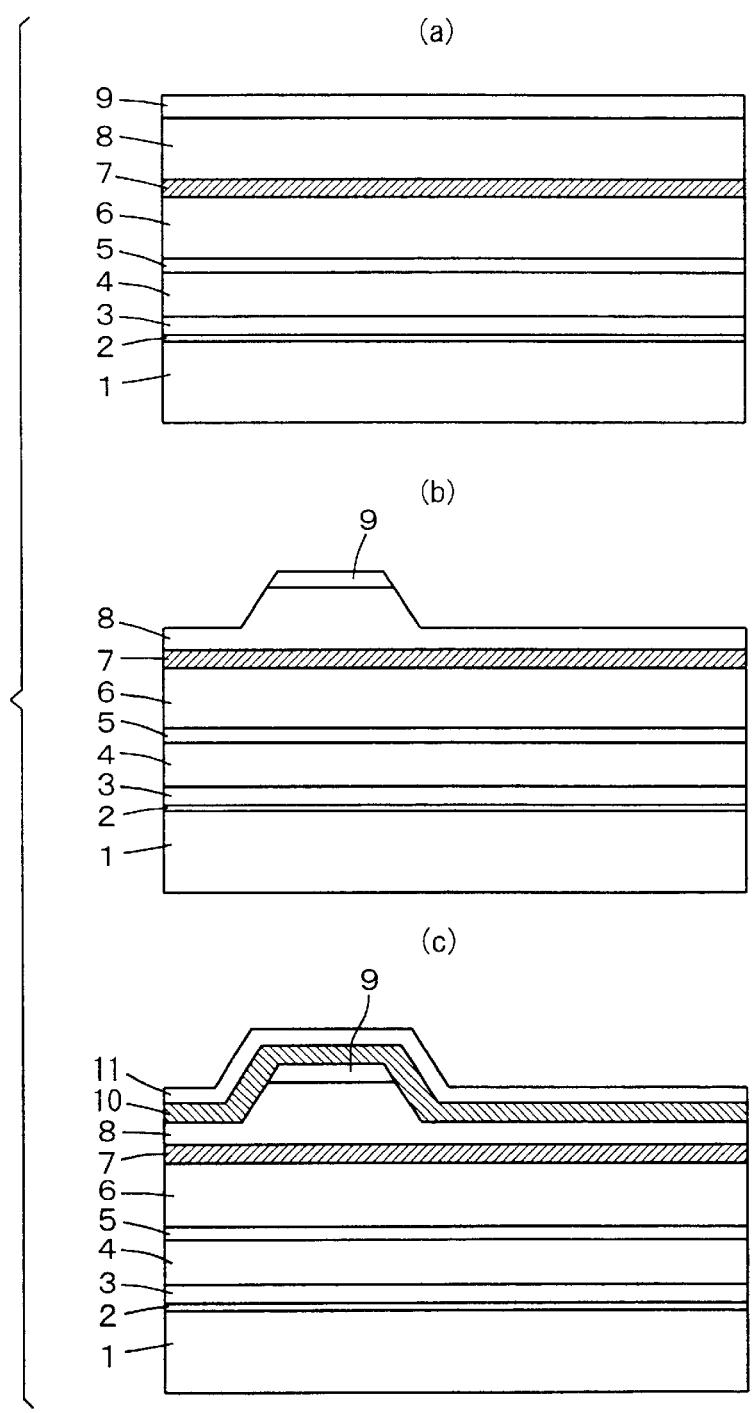
FIG. 1 is a schematic cross-sectional view showing the steps of a method of fabricating a semiconductor laser device in an embodiment of the present invention.

FIG. 1 is a schematic cross-sectional view showing the steps of a method of fabricating a semiconductor laser device in an embodiment of the present invention.

As shown in FIG. 1(a), a sapphire substrate 1 is arranged inside an MOCVD (Metal Organic Chemical Vapor Deposition) device. An AlGaN buffer layer 2 composed of undoped AlGaN, an undoped GaN layer 3, an n-GaN contact layer 4, an n-InGaN crack preventing layer 5, an n-AlGaN cladding layer 6, an MQW (multi quantum well) active layer 7 composed of InGaN, a p-AlGaN cladding layer 8, and a p-GaN cap layer 9 are grown in this order on a C(0001) plane of the sapphire substrate 1 by MOCVD.

In this case, a substrate temperature at the time of growing the AlGaN buffer layer 2 is taken as 600° C., and substrate temperatures at the time of growing the MQW active layer 7 and the n-InGaN crack preventing layer 5 are taken as 800° C. Further, a substrate temperature at the time of growing each of the other layers 3, 4, 6, 8, and 9 is taken as 1000° C. Si is used as an n-type dopant, and Mg is used as a p-type dopant.

Subsequently, a wafer is taken out of the MOCVD device, to etch predetermined regions of the p-GaN cap layer 9 and the p-AlGaN cladding layer 8 by RIBE (Reactive Ion Beam Etching) or the like, as shown in FIG. 1(b). A ridge portion is thus formed.

After the ridge portion is formed, an upper surface and side surfaces of the ridge portion as well as a surface of a flat portion of the p-AlGaN cladding layer 8 are oxidized in the air.

After the ridge portion is formed, the wafer is returned to the MOCVD device again. As shown in FIG. 1(c), n-Al0.5Ga0.5N which has been doped to be of an n type with Si is grown on the upper surface and the side surfaces of the ridge portion and on the flat portion of the p-AlGaN cladding layer 8, to form an n-AlGaN first regrown low-temperature buffer layer 10 having a thickness of 250 Å. Further, an n-AlGaN current blocking layer 11 which has been doped to be of an n type with Si is grown on the n-AlGaN first regrown low-temperature buffer layer 10. In this case, a substrate temperature at the time of growing the n-AlGaN first regrown low-temperature buffer layer 10 is taken as 600° C., and a substrate temperature at the time of growing the n-AlGaN current blocking layer 11 is taken as 1000° C.

As described above, n-AlGaN is regrown at a low temperature on the flat portion of the p-AlGaN cladding layer 8 and on the upper surface and the side surfaces of the ridge portion, which have been taken out once, to form the n-AlGaN first regrown low-temperature buffer layer 10, and the n-AlGaN current blocking layer 11 is formed on the n-AlGaN first regrown low-temperature buffer layer 10. Accordingly, the n-AlGaN current blocking layer 11 can be grown without being affected by the oxidized surface of the p-AlGaN cladding layer 8. Consequently, the number of lattice defects in the n-AlGaN current blocking layer 11 is reduced.

Furthermore, stress created by growing the n-AlGaN current blocking layer 11 is relieved by the n-AlGaN first regrown low-temperature buffer layer 10. Consequently, it is possible to prevent the n-AlGaN current blocking layer 11 from being cracked.

From the foregoing, even when the n-AlGaN current blocking layer 11 having a large thickness and having a high Al composition ratio is formed, the n-AlGaN current blocking layer 11 is not cracked, and good crystallizability is realized therein.

Figure 2:
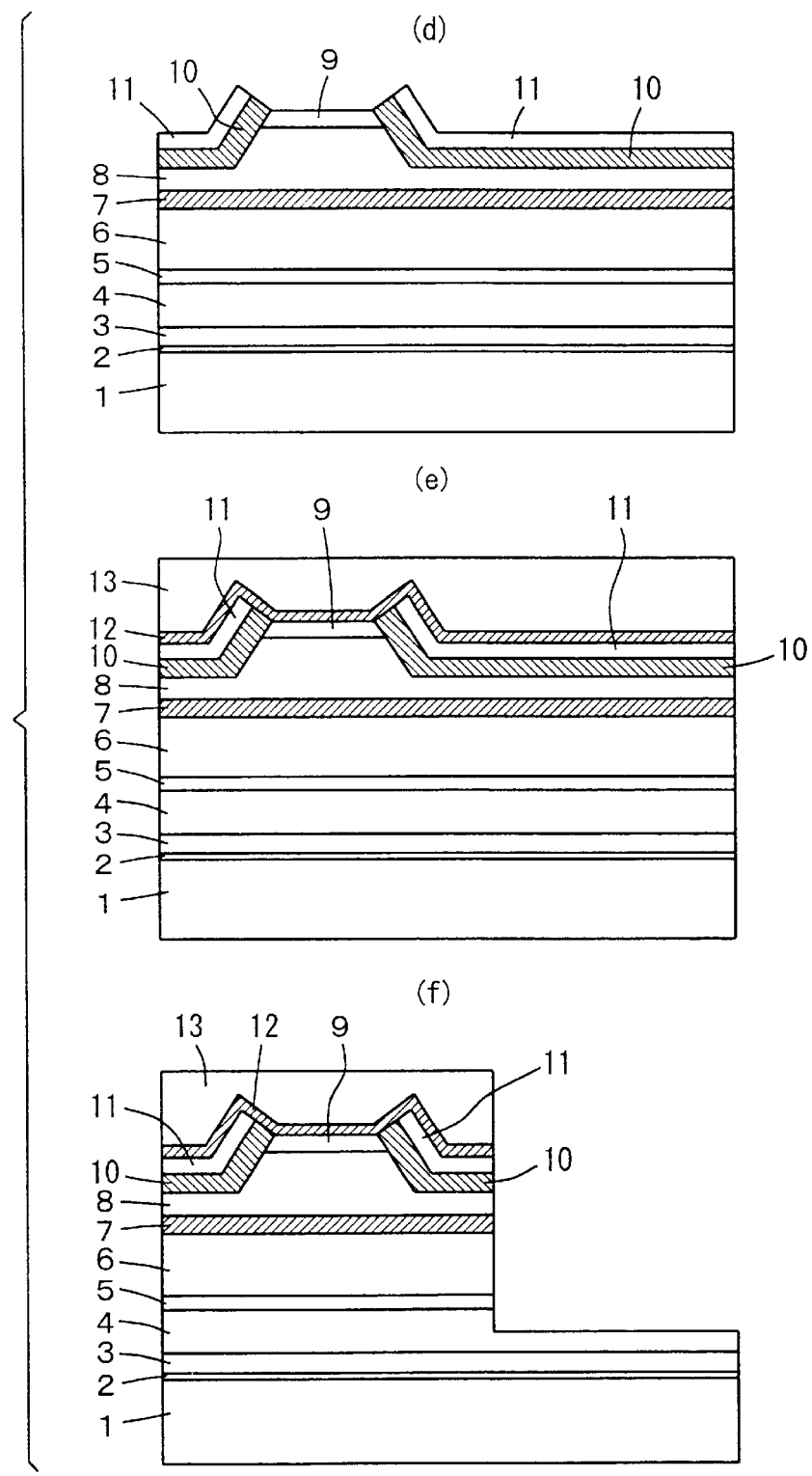
FIG. 2 is a schematic cross-sectional view showing the steps of a method of fabricating a semiconductor laser device in an embodiment of the present invention.

The wafer is then taken out of the MOCVD device, to etch regions, on the ridge portion, of the n-AlGaN first regrown low-temperature buffer layer 10 and the n-AlGaN current blocking layer 11 by RIBE or the like, as shown in FIG. 2(d). A striped opening is thus formed in the n-AlGaN first regrown low-temperature buffer layer 10 and the n-AlGaN current blocking layer 11, to expose the p-GaN cap layer 9.

When the wafer is taken out, the surfaces of the n-AlGaN current blocking layer 11 and the exposed p-GaN cap layer 9 are oxidized.

Figure 8:
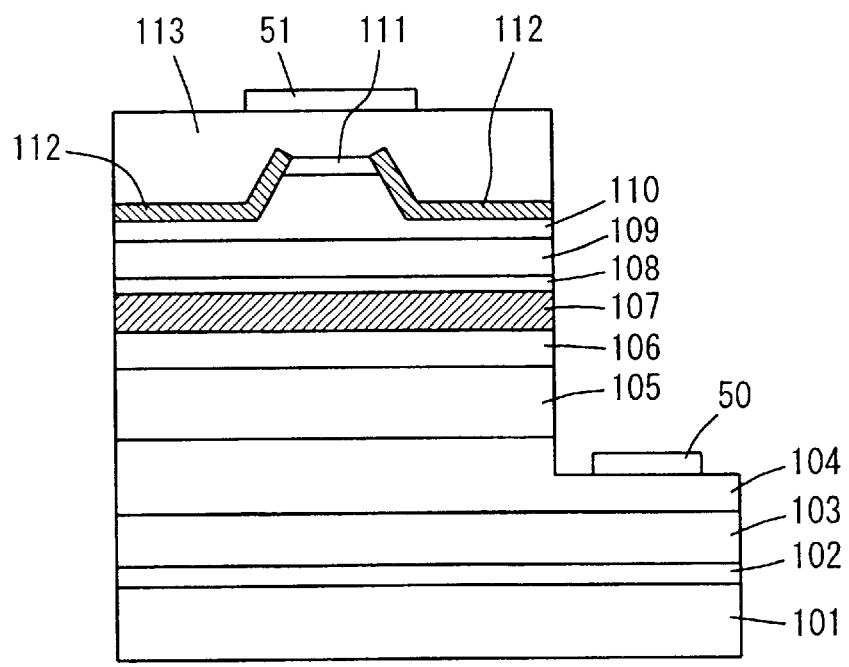
FIG. 8 is a schematic cross-sectional view showing an example of a conventional semiconductor laser device.

In the n-AlGaN current blocking layer 11 formed on the n-AlGaN first regrown low-temperature buffer layer 10, the effect of the oxidized upper surface and side surfaces of the ridge portion and the oxidized surface of the flat portion of the p-AlGaN cladding layer 8 is alleviated by the n-AlGaN first regrown low-temperature buffer layer 10, as described above. Therefore, even when the surface of the n-AlGaN current blocking layer 11 is oxidized as described above, the crystallizability in the n-AlGaN current blocking layer 11 is better than that in the conventional n-AlGaN current blocking layer 112 shown in FIG. 8.

After the above-mentioned etching, the wafer is returned to the MOCVD device again. As shown in FIG. 2(e), p-Al0.5Ga0.5N which has been doped to be of a p type with Mg is regrown on the exposed p-GaN cap layer 9, on the side surfaces of the n-AlGaN first regrown low-temperature buffer layer 10 and the n-AlGaN current blocking layer 11, and on the n-AlGaN current blocking layer 11, to form a p-AlGaN second regrown low-temperature buffer layer 12 having a thickness of 50 Å. Further, a p-GaN contact layer 13 which has been doped to be of a p type with Mg is grown on the p-AlGaN second regrown low-temperature buffer layer 12. In this case, a substrate temperature at the time of growing the p-AlGaN second regrown low-temperature buffer layer 12 is taken as 600° C., and a substrate temperature at the time of growing the p-GaN contact layer 13 is taken as 1000° C.

As described in the foregoing, p-AlGaN is regrown at a low temperature on the n-AlGaN current blocking layer 11 and on the p-GaN cap layer 9 in the ridge portion, which have been taken out once, to form the p-AlGaN second regrown low-temperature buffer layer 12, and the p-GaN contact layer 13 is formed on the p-AlGaN second regrown low-temperature buffer layer 12. Accordingly, the p-GaN contact layer 13 can be grown without being affected by the oxidized surfaces of the n-AlGaN current blocking layer 11 and the p-GaN cap layer 9. Consequently, the number of lattice defects in the p-GaN contact layer 13 is reduced.

Furthermore, stress created by growing the p-GaN contact layer 13 is relieved by the p-AlGaN second regrown low-temperature buffer layer 12. Consequently, it is possible to prevent the p-GaN contact layer 13 from being cracked.

From the foregoing, even when the p-GaN contact layer 13 having a large thickness is formed, the p-GaN contact layer 13 is not cracked, and good crystallizability is realized therein.

The wafer is then taken out of the MOCVD device, to etch a partial region from the p-GaN contact layer 13 to the n-GaN contact layer 4, as shown in FIG. 2(f). A predetermined region of the n-GaN contact layer 4 is thus exposed.

Furthermore, an n electrode 50 is formed on the exposed predetermined region of the n-GaN contact layer 4, and a p electrode 51 is formed on the predetermined region of the p-GaN contact layer 13. Finally, the sapphire substrate 1 is cleaved, thereby forming an end surface of a cavity.

Figure 3:
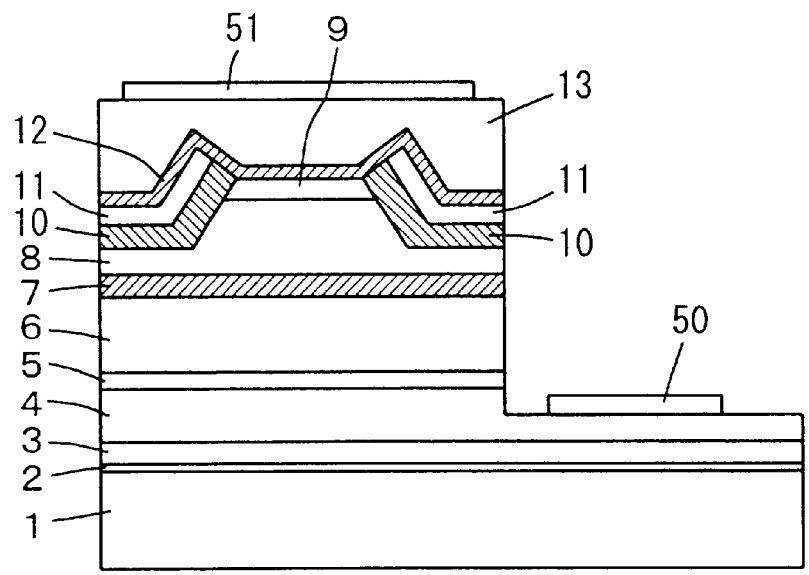
FIG. 3 is a schematic cross-sectional view showing a semiconductor laser device fabricated by the fabricating method shown in FIGS. 1 and 2.

By the foregoing method, a semiconductor laser device 200 having a ridge wave-guided structure shown in FIG. 3 is fabricated.

In the semiconductor laser device 200, a current injected from the p electrode 51 is narrowed down by the n-AlGaN current blocking layer 11. Consequently, a region under the ridge portion serves as a current path. On the other hand, the n-AlGaN current blocking layer 11 has a high Al composition ratio. Accordingly, in the MQW active layer 7, the effective refractive index in a region under the ridge portion is higher than the effective refractive index in regions on both sides thereof.

From the foregoing, in the semiconductor laser device 200, light is confined in the MQW active layer 7 under the ridge portion, so that transverse mode control is carried out. The semiconductor laser device 200 is thus a semiconductor laser device having a real refractive index guided structure.

In the semiconductor laser device 200, the n-AlGaN first regrown low-temperature buffer layer 10 prevents the occurrence of the crack and the degradation of the crystallizability in the n-AlGaN current blocking layer 11, thereby improving device characteristics and reliability. Consequently, it is easy to fabricate a semiconductor laser device with a transverse mode.

Furthermore, in the semiconductor laser device 200, the p-AlGaN second regrown low-temperature buffer layer 12 prevents the occurrence of the crack and the degradation of the crystallizability in the p-GaN contact layer 13. Consequently, in the semiconductor laser device 200, the device characteristics are further improved.

Although in the foregoing, the substrate temperatures at the time of growing the n-AlGaN first regrown low-temperature buffer layer 10 and the p-AlGaN second regrown low-temperature buffer layer 12 are taken as 600° C., the substrate temperatures at the time of growing the layers 10 and 12 are not limited to the foregoing value, provided that they are within a range of 500 to 700° C.

Although in the foregoing, the n-AlGaN first regrown low-temperature buffer layer 10 and the p-AlGaN second regrown low-temperature buffer layer 12 are composed of $Al_{0.5}Ga_{0.5}N$, the Al composition in the layers 10 and 12 is not limited to the same. Each of the n-AlGaN first regrown low-temperature buffer layer 10 and the p-AlGaN second regrown low-temperature buffer layer 12 may be composed of $Al_xGa_{1-x}N$ having an Al composition ratio X satisfying $0<X<0.7$.

Furthermore, although in the foregoing, the thickness of the n-AlGaN first regrown low-temperature buffer layer 10 is taken as 250 Å, and the thickness of the p-AlGaN second regrown low-temperature buffer layer 12 is taken as 50 Å, the thicknesses of the n-AlGaN first regrown low-temperature buffer layer 10 and the p-AlGaN second regrown low-temperature buffer layer 12 are not limited to the same. The thickness of the n-AlGaN first regrown low-temperature buffer layer 10 may be 20 to 500 Å, and the thickness of the p-AlGaN second regrown low-temperature buffer layer 12 may be 20 to 150 Å.

In the semiconductor laser device 200, the p-AlGaN second regrown low-temperature buffer layer 12 is formed in the ridge portion serving as a current path. The p-AlGaN second regrown low-temperature buffer layer 12 which has been grown at a low temperature is high resistive. In a case where the thickness of the p-AlGaN second regrown low-temperature buffer layer 12 is increased, therefore, a current does not easily flow. Consequently, it is preferable that the thickness of the p-AlGaN second regrown low-temperature buffer layer 12 is decreased. When the thickness of the p-AlGaN second regrown low-temperature buffer layer 12 is made small, for example, 50 Å, as described above, the current easily flows in the p-AlGaN second regrown low-temperature buffer layer 12 by the tunneling effect.

The compositions in the first and second regrown low-temperature buffer layers 10 and 12 are not limited to AlGaN, described above. Each of the first and second regrown low-temperature buffer layers 10 and 12 may be composed of a nitride based semiconductor containing at least one of Ga, Al, In, B, and Tl.

It is preferable that the first and second regrown low-temperature buffer layers 10 and 12 contain Al because the degree of transparency thereof is high and the film quality thereof is good.

Although in the foregoing, the first regrown low-temperature buffer layer 10 of an n type and the regrown low-temperature buffer layer 12 of a p type are formed, the first and second regrown low-temperature buffer layers 10 and 12 may be undoped when they have thicknesses of several tens of angstrom. However, it is desirable that they are not undoped in order to reduce an operating voltage. Further, Zn may be doped into the first regrown low-temperature buffer layer 10. The Zn doped first regrown low-temperature buffer layer 10 is high resistive.

Each of the layers 2 to 9, 11 and 13 may have a composition other than the above-mentioned composition, provided that it is composed of a nitride based semiconductor containing at least one of Ga, Al, In, B, and Tl. When the current blocking layer 11 is composed of InGaN, the semiconductor laser device 200 has a loss guided structure.

The current blocking layer 11 may contain Zn as impurities. The current blocking layer 11 containing Zn is high resistive.

Furthermore, although in the foregoing, the n-type semiconductor layer and the p-type semiconductor layer are formed in this order on the sapphire substrate 1, the p-type semiconductor layer and the n-type semiconductor layer may be formed in this order on the sapphire substrate 1. In this case, the first regrown low-temperature buffer layer 10 which has been doped to be of a P type or the first regrown low-temperature buffer layer 10 which has been undoped is formed. Alternatively, the Zn doped and high-resistive first regrown low-temperature buffer layer 10 may be formed. In this case, the second regrown low-temperature buffer layer 12 which has been doped to be of an n type or the second regrown low-temperature buffer layer 12 which has been undoped is formed.

Although in the above-mentioned semiconductor laser device 200, the first and second regrown low-temperature buffer layers 10 and 12 are formed, the semiconductor laser device 200 may be a semiconductor laser device having a structure in which one of the first regrown low-temperature buffer layer 10 and the second regrown low-temperature buffer layer 12 is formed. Description is now made of this case.

Figure 4:
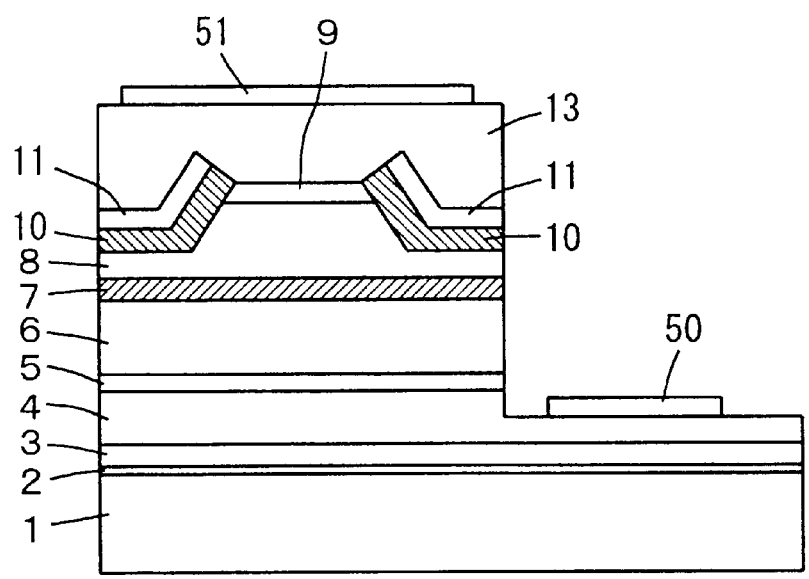
FIG. 4 is a schematic cross-sectional view showing a semiconductor laser device in another embodiment of the present invention.

FIG. 4 is a schematic cross-sectional view of a semiconductor laser device in another embodiment of the present invention.

A semiconductor laser device 201 shown in FIG. 4 has the same structure as the semiconductor laser device 200 shown in FIG. 3 except that the p-AlGaN second regrown low-temperature buffer layer 12 is not formed. The semiconductor laser device 201 is fabricated in the same method as the method of fabricating the semiconductor laser device 200 except for the following.

In this case, an n-AlGaN regrown low-temperature buffer layer 10 and an n-AlGaN current blocking layer 11 as shown in FIG. 2(d) are etched, and p-GaN is then directly regrown on an n-GaN cap layer 9 in a ridge portion, on side surfaces of the n-AlGaN regrown low-temperature buffer layer 10 and the n-AlGaN current blocking layer 11, and on the n-AlGaN current blocking layer 11, to form a p-GaN contact layer 13.

In the semiconductor laser device 201, the n-AlGaN regrown low-temperature buffer layer 10 prevents occurrence of a crack and degradation of crystallizability in the n-AlGaN current blocking layer 11, as in the semiconductor laser device 200. Consequently, an operating voltage is reduced in the semiconductor laser device 201, thereby improving device characteristics.

In the semiconductor laser device 201, the high-resistive p-AlGaN second regrown low-temperature buffer layer 12, as in the semiconductor laser device 200, is not formed in the ridge portion serving as a current path. Therefore, the operating voltage is further reduced in the semiconductor laser device 201.

Furthermore, the semiconductor laser device may be a semiconductor laser device having the same structure as the semiconductor laser device 200 shown in FIG. 3 except that the n-AlGaN first regrown low-temperature buffer layer 10 is not formed. In this case, the semiconductor laser device is fabricated by the same method as the method of fabricating the semiconductor laser device 200 except that the ridge portion is formed, and the n-AlGaN current blocking layer 11 is then directly formed on an upper surface and side surfaces of the ridge portion and on a flat portion of the p-AlGaN cladding layer 8. In the semiconductor laser device thus fabricated, the p-AlGaN second regrown low-temperature buffer layer 12 prevents occurrence of a crack and degradation of crystallizability in the p-GaN contact layer 13. Also in the semiconductor laser device in which only the p-AlGaN second regrown low-temperature buffer layer 12 is formed, therefore, device characteristics and reliability are improved, as compared with those in the conventional semiconductor laser device.

Figure 5:
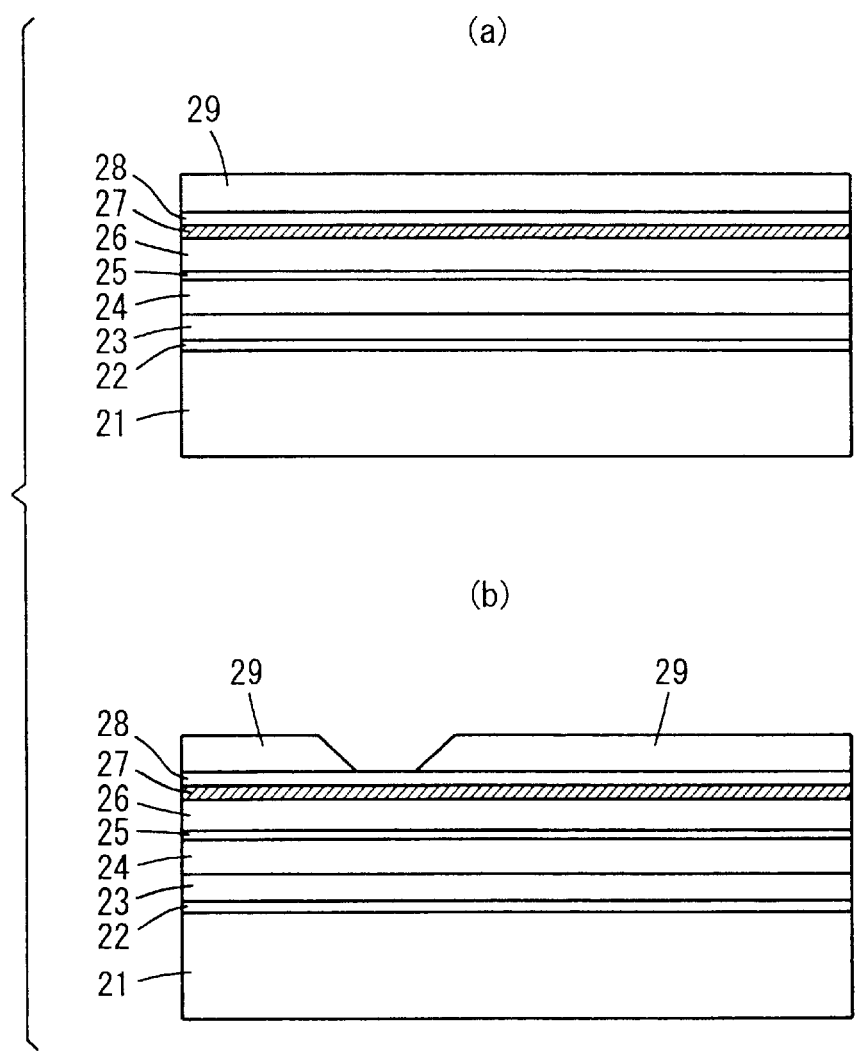
FIG. 5 is a schematic cross-sectional view showing the steps of a method of fabricating a semiconductor laser device in still another embodiment of the present invention.

FIG. 5 is a schematic cross-sectional view showing the steps of a method of fabricating a semiconductor laser device in still another embodiment of the present invention.

As shown in FIG. 5(a), a sapphire substrate 21 is arranged inside an MOCVD device. An AlGaN buffer layer 22 composed of undoped AlGaN, an undoped GaN layer 23, an n-GaN contact layer 24, an n-InGaN crack preventing layer 25, an n-AlGaN cladding layer 26, an MQW active layer 27 composed of InGaN, a p-AlGaN first cladding layer 28, and an n-AlGaN current blocking layer 29 are grown in this order on a C (0001) plane of the sapphire substrate 21 inside the MOCVD device.

In this case, a substrate temperature at the time of growing the AlGaN buffer layer 22 is taken as 600° C., and substrate temperatures at the time of growing the MQW active layer 27 and the n-InGaN crack preventing layer 25 are taken as 800° C. Further, a substrate temperature at the time of growing each of the other layers 23, 24, 26, 28, and 29 is taken as 1000° C. Si is used as an n-type dopant, and Mg is used as a p-type dopant.

Subsequently, a wafer is taken out of the MOCVD device, to etch a predetermined region of the n-AlGaN current blocking layer 29 by RIBE or the like, as shown in FIG. 5(b). A striped opening is thus formed in the n-AlGaN current blocking layer 29, and the p-AlGaN first cladding layer 28 is exposed inside the opening.

When the wafer is taken out, the surfaces of the n-AlGaN current blocking layer 29 and the p-AlGaN first cladding layer 28 inside the opening are oxidized.

Figure 6:
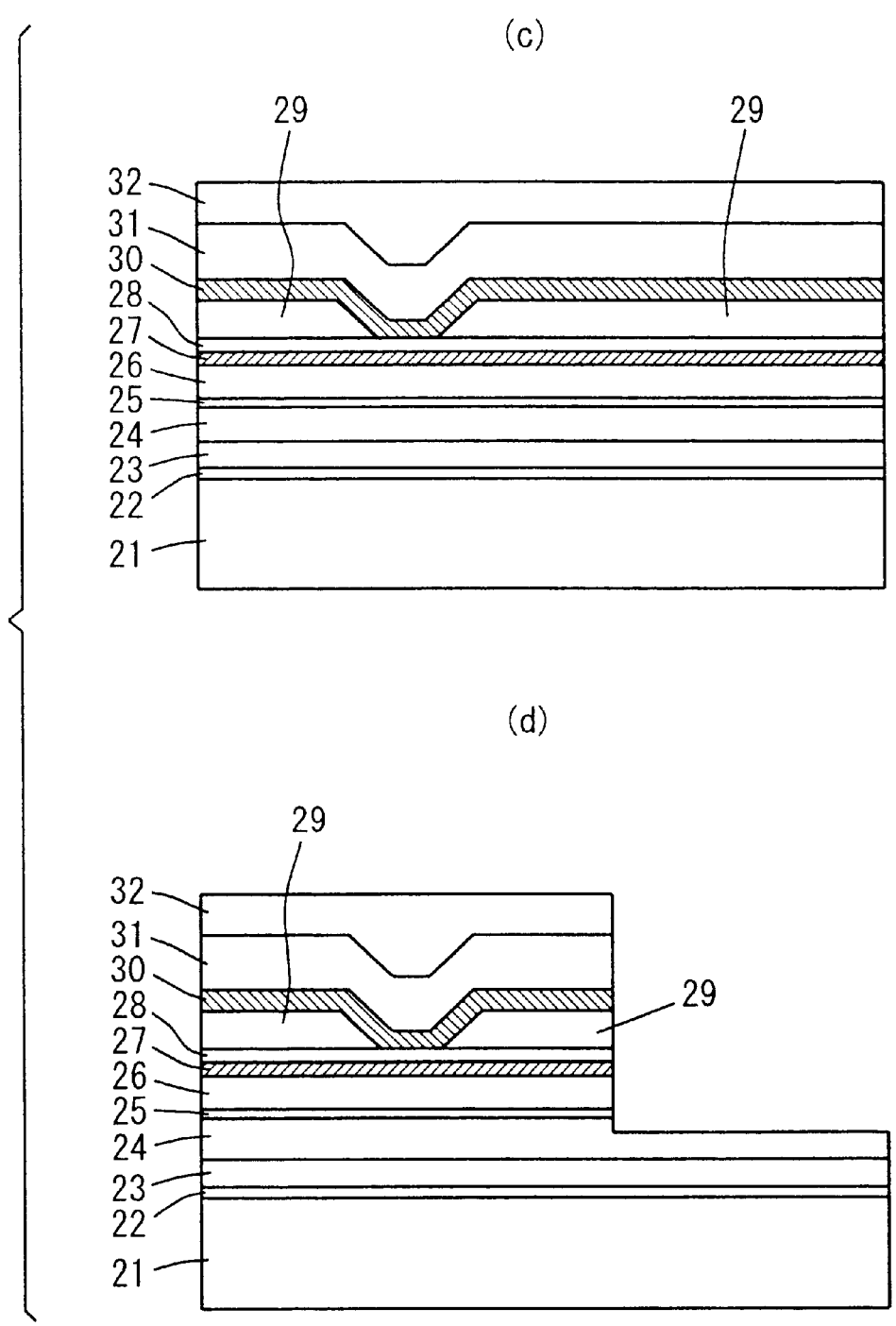
FIG. 6 is a schematic cross-sectional view showing the steps of a method of fabricating a semiconductor laser device in still another embodiment of the present invention.

After the above-mentioned etching, the wafer is returned to the MOCVD device again. As shown in FIG. 6(c), p-$Al_{0.5}Ga_{0.5}N$ which has been doped to be of a p type with Mg is regrown on the n-AlGaN current blocking layer 29 and the p-AlGaN first cladding layer 28, to form a p-AlGaN regrown low-temperature buffer layer 30 having a thickness of 5.0 Å. Further, a p-AlGaN second cladding layer 31 and a p-GaN contact layer 32 which have been doped to be of a p type with Mg are grown in this order on the p-AlGaN regrown low-temperature buffer layer 30. In this case, a substrate temperature at the time of growing the p-AlGaN regrown low-temperature buffer layer 30 is taken as 600° C., and substrate temperatures at the time of growing the p-AlGaN second cladding layer 31 and the p-GaN contact layer 32 are taken as 1000° C.

As described in the foregoing, p-AlGaN is regrown at a low temperature on the n-AlGaN current blocking layer 29 and on the p-AlGaN first cladding layer 28 inside the opening, which have been taken out and cooled once, to form the p-AlGaN regrown low-temperature buffer layer 30, and the p-AlGaN second cladding layer 31 is formed on the p-AlGaN regrown low-temperature buffer layer 30. Accordingly, the p-AlGaN second cladding layer 31 can be grown without being affected by the oxidized surfaces of the n-AlGaN current blocking layer 29 and the p-AlGaN first cladding layer 28. Consequently, the number of lattice defects in the p-AlGaN second cladding layer 31 is reduced.

Furthermore, stress created by growing the p-AlGaN second cladding layer 31 and the p-GaN contact layer 32 is relieved by the p-AlGaN regrown low-temperature buffer layer 30. Consequently, it is possible to prevent the p-AlGaN second cladding layer 31 and the p-GaN contact layer 32 from being cracked.

From the foregoing, the p-AlGaN second cladding layer 31 and the p-GaN contact layer 32 are not cracked, and good crystallizability is realized therein.

The wafer is then taken out of the MOCVD device, to etch a partial region from the p-GaN contact layer 32 to the n-GaN contact layer 24, as shown in FIG. 6(d). A predetermined region of the n-GaN contact layer 24 is thus exposed.

Furthermore, an n electrode 50 is formed on the exposed predetermined region of the n-GaN contact layer 24, and a p electrode 51 is formed on a predetermined region of the p-GaN contact layer 32. Finally, the sapphire substrate 21 is cleaved, thereby forming an end surface of a cavity.

Figure 7:
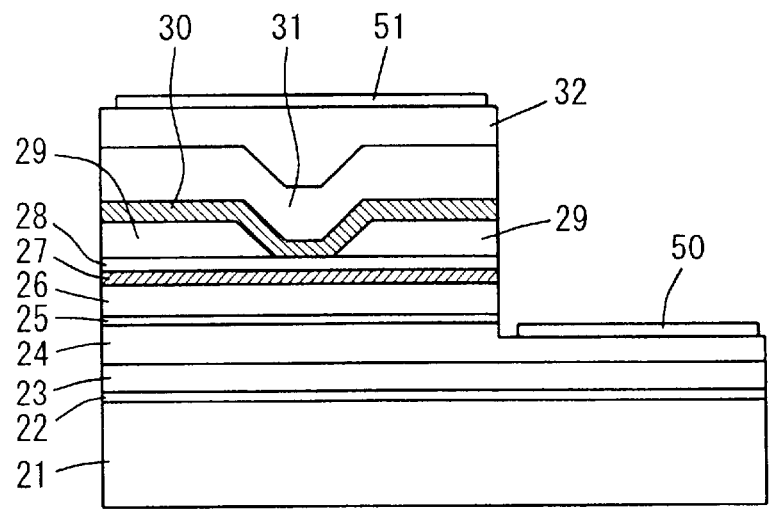
FIG. 7 is a schematic cross-sectional view showing a semiconductor laser device fabricated by the fabricating method shown in FIGS. 5 and 6.

In the foregoing manner, a semiconductor laser device 202 having a self-alignment structure shown in FIG. 7 is fabricated.

In the semiconductor laser device 202, a current injected from the p electrode 51 is narrowed down by the n-AlGaN current blocking layer 29. Consequently, a region under the opening of the n-AlGaN current blocking layer 29 serves as a current path. On the other hand, the n-AlGaN current blocking layer 29 has a high Al composition ratio. Accordingly, in the MQW active layer 27, the effective refractive index in a region, under the opening, of the AlGaN current blocking layer 29 is higher than the effective refractive index in regions on both sides thereof.

From the foregoing, in the semiconductor laser device 202, light is confined in the MQW active layer 27 under the opening of the n-AlGaN current blocking layer 29, so that transverse mode control is carried out. The semiconductor laser device 202 is thus a semiconductor laser device having a real refractive index guided structure.

The n-AlGaN current blocking layer 29 in the semiconductor laser device 202 is not a layer regrown after the wafer is taken out of the MOCVD device once. Therefore, the n-AlGaN current blocking layer 29 is not easily cracked.

In the semiconductor laser device 202, the p-AlGaN regrown low-temperature buffer layer 30 prevents the occurrence of the crack and the degradation of the crystallizability in the p-AlGaN second cladding layer 31. Consequently, an operating voltage in the semiconductor laser device 202 is reduced, thereby improving device characteristics.

Although in the foregoing, the substrate temperature at the time of growing the p-AlGaN regrown low-temperature buffer layer 30 is taken as 600° C., the substrate temperature at the time of growing the p-AlGaN regrown low-temperature buffer layer 30 is not limited to the foregoing value, provided that it is within a range of 500 to 700° C.

Although in the foregoing, the p-AlGaN regrown low-temperature buffer layer 30 is composed of $Al_{0.5}Ga_{0.5}N$, the Al composition in the p-AlGaN regrown low-temperature buffer layer 30 is not limited to the same. The p-AlGaN regrown low-temperature buffer layer 30 may be composed of $Al_xGa_{1-x}N$ having an Al composition ratio X satisfying a range of 0<X<0.7.

Furthermore, although in the foregoing, the thickness of the p-AlGaN regrown low-temperature buffer layer 30 is taken as 50 Å, the thickness of the p-AlGaN regrown low-temperature buffer layer 30 is not limited to the same. The thickness of the p-AlGaN regrown low-temperature buffer layer 30 may be 20 to 150 Å.

In the semiconductor laser device 202, the p-AlGaN regrown low-temperature buffer layer 30 is formed on the opening of the n-AlGaN current blocking layer 29 serving as a current path. The p-AlGaN regrown low-temperature buffer layer 30 which has been grown at a low temperature is high resistive. In a case where the thickness of the p-AlGaN regrown low-temperature buffer layer 30 is increased, therefore, a current does not easily flow. Consequently, it is preferable that the thickness of the p-AlGaN regrown low-temperature buffer layer 30 is decreased. When the thickness of the p-AlGaN regrown low-temperature buffer layer 30 is made small, for example, 50 Å, as described above, the current easily flow in the p-AlGaN regrown low-temperature buffer layer 30 by the tunneling effect.

Although in the foregoing, the p-type regrown low-temperature buffer layer 30 is formed, the regrown low-temperature buffer layer 30 may be undoped when it has a thickness of several tens of angstrom. However, it is desirable that it is not undoped in order to reduce the operating voltage.

The composition in the regrown low-temperature buffer layer 30 is not limited to AlGaN, described above. The regrown low-temperature buffer layer 30 may be composed of a nitride based semiconductor containing at least one of Ga, Al, In, B, and Tl.

It is preferable that the regrown low-temperature buffer layer 30 contains Al because the degree of transparency thereof is high and the film quality thereof is good.

Each of the layers 22 to 29, 31, and 32 may have a composition other than the above-mentioned composition, provided that it is composed of a nitride based semiconductor containing at least one of Ga, Al, In, B, and Tl. When the current blocking layer 29 is composed of InGaN, the semiconductor laser device 202 has a loss guided structure.

The current blocking layer 29 may contain Zn as impurities. The current blocking layer 29 containing Zn is high resistive.

Furthermore, although in the foregoing, the n-type semiconductor layer and the p-type semiconductor layer are formed in this order on the sapphire substrate 21, the p-type semiconductor layer and the n-type semiconductor layer may be formed in this order on the sapphire substrate 21. In this case, the regrown low-temperature buffer layer 30 which has been doped to be of an n type or the regrown low-temperature buffer layer 30 which has been undoped is formed.

Although description was made of a case where the method of fabricating a semiconductor device according to the present invention is applied to the fabrication of the semiconductor laser device, the method of fabricating a semiconductor device according to the present invention is also applicable in the fabrication of a semiconductor light emitting device other than the semiconductor laser device, a light receiving device such as a photodiode, and an electronic device such as a transistor.

Although description was made of a case where the regrown low-temperature buffer layer is formed at the time of regrowth after etching, the regrown low-temperature buffer layer may be formed at the time of regrowth after processing steps other than etching.

In the semiconductor laser device 200 shown in FIG. 3, for example, a striped opening may be formed in the regrown low-temperature buffer layer 10 and the n-AlGaN current blocking layer 11 by not etching but a selective growth method using an insulating film. In this case, an insulating film such as SiO2 is formed on the upper surface of the ridge portion outside the crystal growth device, and the n-AlGaN first regrown low-temperature buffer layer 10 and the n-AlGaN current blocking layer 11 are then grown on the side surfaces of the ridge portion and on the flat portion of the p-AlGaN cladding layer 8 inside the crystal growth device. After the n-AlGaN first regrown low-temperature buffer layer 10 and the n-AlGaN current blocking layer 11 are formed, the insulating film is removed outside the crystal growth device again, thereby forming the striped opening. After the n-AlGaN first regrown low-temperature buffer layer 10 and the n-AlGaN current blocking layer 11 are processed using the insulating film, the p-AlGaN second regrown low-temperature buffer layer 12 is formed on the n-AlGaN current blocking layer 11 and the p-GaN cap layer 9 exposed inside the opening. Consequently, the p-GaN contact layer 13 formed on the p-AlGaN second regrown low-temperature buffer layer 12 is prevented from being cracked, and crystallizability therein is improved.

Furthermore, the place where the regrown low-temperature buffer layer is formed is not particularly limited, provided that it is the place where it is regrown after processing steps such as etching.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the steps of:
   forming a first semiconductor layer composed of a nitride based semiconductor on a substrate inside a crystal growth device at a first temperature;
   taking the substrate on which said first semiconductor layer is formed out of said crystal growth device to subject the substrate taken out to predetermined processing:
      forming a buffer layer composed of a nitride based semiconductor inside said crystal growth device on the first semiconductor layer on said processed substrate at a second temperature lower than said first temperature; and
      forming a second semiconductor layer composed of a nitride based semiconductor at a temperature higher than said second temperature on said buffer layer inside said crystal growth device.

2. The method according to claim 1, wherein
the step of forming said buffer layer comprises the step of forming said buffer layer at said second temperature of not less than 500° C. nor more than 700° C.

3. The method according to claim 1, wherein
the step of forming said first semiconductor layer comprises the step of forming an active layer and the step of forming a cladding layer on said active layer,
the step of performing said predetermined processing comprises the step of removing a region excluding a striped region at the center of said cladding layer, to form a flat portion and a ridge portion on said flat portion,
the step of forming said buffer layer comprises the step of forming said buffer layer on said flat portion and on side surfaces of said ridge portion, and
the step of forming said second semiconductor layer comprises the step of forming a current blocking layer on said buffer layer.

4. The method according to claim 3, wherein
the step of forming said buffer layer comprises the step of forming said buffer layer having a thickness of not less than 20 Å nor more than 500 Å.

5. The method according to claim 1, wherein
the step of forming said first semiconductor layer comprises the step of forming an active layer, the step of forming a cladding layer having a flat portion on said active layer and a ridge portion on the flat portion, and the step of forming a current blocking layer on said cladding layer,
the step of performing said predetermined processing comprises the step of forming a striped opening in said current blocking layer, to expose an upper surface of said ridge portion, and
the step of forming said buffer layer comprises the step of forming the buffer layer on said current blocking layer and on an inner bottom surface and inner side surfaces of said striped opening.

6. The method according to claim 5, wherein the step of forming said buffer layer comprises the step of forming said buffer layer having a thickness of not less than 20 Å nor more than 150 Å.

7. The method according to claim 5, wherein
the step of forming said first semiconductor layer comprises the step of forming a cap layer on the upper surface of said ridge portion of said cladding layer.

8. The method according to claim 1, wherein
the step of forming said first semiconductor layer comprises the step of forming an active layer, the step of forming a cladding layer on said active layer, and the step of forming a current blocking layer on said cladding layer,
the step of performing said predetermined processing comprises the step of forming a striped opening in said current blocking layer, to expose said first semiconductor layer inside said striped opening, and
the step of forming said buffer layer comprises the step of forming a buffer layer on said current blocking layer and on an inner bottom surface and inner side surfaces of said striped opening.

9. The method according to claim 8, wherein
the step of forming said buffer layer comprises the step of forming said buffer layer having a thickness of not less than 20 Å nor more than 150 Å.

* * * * *